United States Patent
Hung et al.

(10) Patent No.: US 6,566,263 B1
(45) Date of Patent: May 20, 2003

(54) METHOD OF FORMING AN HDP CVD OXIDE LAYER OVER A METAL LINE STRUCTURE FOR HIGH ASPECT RATIO DESIGN RULE

(75) Inventors: Mong-Chi Hung, Yurdin (TW); Ming-Tsong Wang, Taipei (TW); Teh-Wei Ger, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/630,452

(22) Filed: Aug. 2, 2000

(51) Int. Cl.[7] ................ H01L 21/4763; H01L 21/44
(52) U.S. Cl. ............... 438/688; 438/618; 438/636; 438/643; 438/770
(58) Field of Search .................. 438/618, 627, 438/636, 628, 643, 644, 653, 654, 688, 770, 759, 778, 787

(56) References Cited

U.S. PATENT DOCUMENTS

| | | | |
|---|---|---|---|
| 5,759,635 A | 6/1998 | Logan | 427/490 |
| 5,811,326 A * | 9/1998 | Yamamoto | |
| 5,872,058 A | 2/1999 | Van Cleemput et al. | 438/692 |
| 5,998,303 A * | 12/1999 | Sato | 438/758 |
| 6,008,120 A | 12/1999 | Lee | 438/634 |
| 6,030,881 A | 2/2000 | Papasouliotis et al. | 438/424 |
| 6,035,803 A | 3/2000 | Robles et al. | 118/723 E |
| 6,171,947 B1 * | 1/2001 | Pangrle et al. | 438/624 |

OTHER PUBLICATIONS

"A Mechanism of Stress–Induced Metal Void in Narrow Aluminum–Based Metallization with the HDP CVD Oxide Dielectric," Soo Geun Lee et al., IEEE, Jun., 1999, pp. 99–149 to 99–151.

"Cu Behaviors Induced by Aging and Their Effects on Electromigration Resistance on Al–Cu Lines," Takeshi Nogami et al., American Institute of Physics, 1996, pp. 198–213.

* cited by examiner

*Primary Examiner*—Ha Tran Nguyen
(74) *Attorney, Agent, or Firm*—George O. Saile; Stephen B. Ackerman; Stephen G. Stanton

(57) ABSTRACT

A method of forming an HDP CVD oxide layer over a metal line structure, comprising the following steps. A semiconductor structure having metal lines formed thereon to form a metal line structure is provided. The metal lines having exposed sidewalls. The metal line structure is treated with $N_2O$ to form a layer of $Al_2O_3$ on each of the metal line exposed sidewalls to form a $N_2O$ treated metal line structure. An HDP CVD oxide layer is formed over the $N_2O$ treated metal line structure to form a resulting metal line structure. Whereby the resulting metal line structure is free of metal voids.

39 Claims, 1 Drawing Sheet

US 6,566,263 B1

METHOD OF FORMING AN HDP CVD OXIDE LAYER OVER A METAL LINE STRUCTURE FOR HIGH ASPECT RATIO DESIGN RULE

FIELD OF THE INVENTION

The present invention relates generally to the use of high density plasma (HDP) chemical vapor deposition (CVD) oxide as intermetal dielectric layers (IMD), and specifically to the use of HDP CVD IMD oxide layers for high aspect ratio design rule for 0.25 to 0.15 μm technology.

BACKGROUND OF THE INVENTION

High density plasma (HDP) chemical vapor deposition (CVD) oxide has been used as an intermetal dielectric layer (IMD) and passivation materials due to its good gap filling capability. This holds true even for HDP fluorinated silica glass (FSG).

HDP CVD combines sputtering and depositing processes. The gap fill capability is influenced under the sputtering action: seams are found under a low sputter; and metal clipping is found under a high sputter.

However, in devices with high aspect ratio design rule for 0.25 to –0.15 μm technology, metal voids were observed in metal lines over which the HDP CVD oxide IMD or passivation layers were formed. Such metal voids cause not only metal line off and serious metal electron migration, but also reliability failures.

U.S. Pat. No. 6.030,881 to Papasouliotis et al. describes forming an HDP CVD layer over an aluminum (Al) line.

U.S. Pat. No. 6,008,120 to Lee describes a process for forming an FSG layer over an Al line.

U.S. Pat. No. 5,872,058 to Van Cleemput et al. describes forming an HDP CVD layer over an Al line.

U.S. Pat. No. 6,035,803 to Robles et al. describes a fluorinated carbon film process.

U.S. Pat. No. 5,759,635 to Logan describes a fluorocarbon polymer PECVD process for a low-k layer.

The article "A Mechanism of Stress-induced Metal Void in narrow Aluminum-based Metallization with the HDP CVD oxide dielectric," Soo Geun Lee et al., IEEE, Jun., 1999, pp. 99–149 to 99–151, proposes a mechanism by which metal voids form when an HDP CVD oxide IMD layer is formed over aluminum (Al) metal lines in devices with 0.25 μm rule. Factors affecting formation of metal voids were: (1) the deposition temperature of the HDP CVD oxide; (2) the metal layer structure; and (3) the line width. Decreasing the deposition temperature of the HDP CVD oxide reduced formation of the metal voids but occurred slightly at metal pitches lower than 0.75 μm. When TiN replaced Ti in glue and capping layers for Al metal lines, no metal voids were observed.

From the experimental results, it is suggested that the hydrostatic stress due to the reaction between the Ti and Al at the high temperature HDP CVD oxide deposition is the major driving force for metal void formation. Probability of metal void formation increases rapidly with the HDP CVD oxide formation temperature due to higher induced stress and faster diffusion at higher temperatures.

Annealing at 450° C. for 30 minutes after metal patterning eliminated void formation at 0.7 μm and 0.64 μm pitch metal lines. Also, when the backside helium (He) pressure was increased from the normal condition of 4.5 Torr inner/9 Torr outer to 7.0 Torr inner/10.0 Torr outer, the density of void formation was slightly reduced. At 0.8 μm pitch of metal pattern, no metal void was observed at RF bias power of 2000 W and 1600 W. However, when the metal pitches were decreased to 0.7 μm and 0.64 μm, metal voids formed at this lower RF bias power.

The article "Cu Behaviors Induced by Aging and Their Effects on Electromigration Resistance on Al-Cu Lines," Takeshi Nogami et al., American Institute of Physics, 1996, pp. 198–213 describes an experimental procedure whereby annealed films were subjected a 250° C. aging treatment, to enhance thermal diffusion of Cu atoms in the grains, and studied to determine the role of segregated Cu atoms at grain boundaries. The role of the preferential diffusion of Cu was studied through comparison of time-to-failure's (TTF's) between treated AlSiCu and AlSi lines. A new model was proposed for understanding the electromagnetic (EM) resistance improvement by adding Cu atoms and the aging treatment that includes the role of the preferential diffusion of Cu atoms along the grain boundary and the role of the segregated Cu atoms.

SUMMARY OF THE INVENTION

Accordingly, it is an object of the present invention to provide a method of eliminating voids in metal lines.

Another object of the present invention to provide a method of eliminating voids in aluminum based metal lines down to 0.25 μm design rule technology.

Yet another object of the present invention is to provide a method of eliminating voids in aluminum based metal lines down to 0.15 μm design rule technology.

Other objects will appear hereinafter.

It has now been discovered that the above and other objects of the present invention may be accomplished in the following manner. Specifically, a semiconductor structure having metal lines formed thereon to form a metal line structure is provided. The metal lines having exposed sidewalls. The metal line structure is treated with $N_2O$ to form a layer of $Al_2O_3$ on each of the metal line exposed sidewalls to form a $N_2O$ treated metal line structure. An HDP CVD oxide layer is formed over the $N_2O$ treated metal line structure to form a resulting metal line structure. Whereby the resulting metal line structure is free of metal voids.

BRIEF DESCRIPTION OF THE DRAWINGS

The features and advantages of the method of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, etc. may be formed or accomplished by conventional methods known in the prior art.

Problem Known to the Inventors

In devices with high aspect ratios design rule for 0.25 to 0.15 μm technology, metal voids were observed in the metal lines with high density plasma (HDP) chemical vapor deposition (CVD) of intermetal dielectric (IMD) and passivation material. The process conditions related to the formation of metal voids were studied. This problem known to the inventors is not prior art.

When titanium nitride (TiN) was used as the glue layer under the aluminum metal lines and also as the overlying capping layer, or anti-reflective coating (ARC), various degrees of metal voids were observed even with the same pattern ratios, but different aspect ratios, under AMAT HDP and Novellus HDP. Specifically, as the metal pitch decreased below 0.8 µm design rule, metal voids were observed at narrow metal lines and were more serious for high aspect ratios under the same pitch condition. The defects appeared not only at the top and side of the Al metal line, but also at the bottom of the metal lines near the boundary between the TiN glue layer and the overlying Al metal line.

The formation of metal voids at various process conditions were studied to propose the mechanism of the stress induced metal voids. Two types of HDP equipment were used for the metal void study. One was the AMAT HDP tool and the other was the Novellus HDP tool. Based on the possible factors, experiments were performed to identify mechanisms and to design a process integration to solve the problem of metal void formation.

From these experiments, several factors were found to influence metal void formation such as HDP deposition temperature, film stress, metal film roughness, and metal density. A new integration process and scheme, subject of the present invention, has been developed to effectively solve the metal void issue that is not only successful for 0.25 µm technology, but also for advanced 0.15 µm technology.

Preferred Embodiment of the Present Invention

Figure 1:
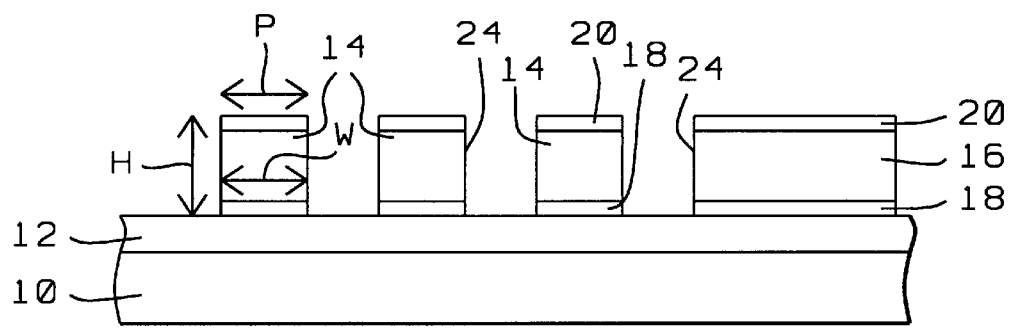
FIGS. 1 to 3 schematically illustrates in cross-sectional representation a preferred embodiment of the present invention.

Accordingly as shown in FIG. 1 starting semiconductor structure 10 includes upper oxide (SiO$_2$) layer 12. Semiconductor structure 10 is also understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

Metal lines 14, 16 are formed over oxide layer 12 by conventional methods. Metal lines 14, 16 may be formed of Al, an AlSiCu alloy, or an AlCu alloy, and are preferably comprised of an aluminum copper alloy (AlCu) containing 0.5% by weight copper.

Metal lines 14, 16 are electrically connected to various devices (not shown) formed within/on semiconductor structure 10 as is known in the art and permits electrically interconnection between such devices and/or with such devices and other electrical connections external to a semiconductor integrated circuit (IC) chip within which semiconductor structure 10 and such devices are incorporated.

Metal lines 14, 16 have exposed sidewalls 24.

Metal lines 14, 16 have a pitch P from about 0.15 up to and over 1.6 µm, and have an aspect ratio (H/W) of from about 2.0 to 4.0, and more preferably about 3.0.

Metal lines 14, 16 have glue layers/under layers 18, respectively, formed between them and oxide layer 12 which serve to bind AlCu lines 14, 16 to oxide layer 12. Glue layers 18 may be formed of (thin Ti deposition before TiN formation), and are preferably comprised of titanium rich titanium nitride (Ti rich TiN). TiN. Glue layers 18 are involved two layers, Ti rich thin layer from about 130 to 170 Å thick, and are preferably about 150 Å thick.

Overlying metal lines 14, 16 are anti-reflective coating (ARC) layers 20. ARC layers 20 may be formed of Ti, TiN, or Ti rich TiN, and are preferably comprised of titanium nitride (TiN). TiN ARC layers are from about 500 to 600 Å thick, and are preferably about 550 Å thick.

Prior methods to eliminate/minimize void formation within metal lines 14, 16 during HDP CVD oxide formation over metal lines 14, 16 to form an IMD layer or a passivation layer 30, for example, have only been able to do so for down to 0.7 to 0.64 µm pitch/design rule of the metal lines 14, 16.

The inventors have determined that metal density of the wafers upon which metal voids are formed by the HDP CVD oxide IMD or passivation layer 30 deposition that lead to metal line abnormalities and serious electromigration (EM) is dividable into two groups: those having a metal density above about 35%; and those having a metal density below about 35%. Metal density is determined by the total amount of surface area of the wafer upon which metal, or metal structures/devices/lines 14, 16 have been formed. For example a blank wafer has a 0% metal density and a wafer totally covered in metal has a metal density of 100%.

Brief Summary of the Invention

The method of the present invention includes treating metal lines 14, 16 with a N$_2$O treatment (see FIG. 2) before the HDP process (see FIG. 3) using either the AMAT or Novellus tools, for example, under high aspect ratio and with either high (greater than 35% (>35%)) or low (less than 35% (<35%)) metal density.

Experimental Results

Various experiments were conducted using the AMAT and Novellus HDP tools, respectively, as noted in the tables below. Note that "X" means failure, i.e. metal voids were formed after HDP CVD oxide IMD or passivation layer formation, and "O" means metal voids were not detected.

Table I

General experiments were conducted with the AMAT and Novellus HDP tools to gauge the degree of metal void formation under the same pattern density, but with different metal thickness and pitches. These experiments were conducted at the following conditions, with the results summarized in TABLE I below:

metal density—greater than 35%;
bias RF power—about 2800 W;
metal line composition—AlCu(0.5% wt.) alloy;
He back pressure (inner He/outer He)—2.5 Torr/9.0 Torr; and
BKM recipe.

TABLE I

| Thickness (Å) | Pitch (µm) → 0.6 | 0.7 | 0.8 | 0.9 | 1.0 | 1.2 | 1.4 | 1.6 |
|---|---|---|---|---|---|---|---|---|
| 4K | O | O | O | O | O | O | O | O |
| 6K | X | X | X | X | X | O | O | O |
| 8K | X | X | X | X | X | X | O | O |
| 9K | X | X | X | X | X | X | X | O |

As shown in TABLE I above, metal void problems worsen with increased metal line 14, 16 thickness and increased aspect ratio. The higher the aspect ratio, the more serious the metal void formation.

Table II

Further experiments were then conducted under different conditions, i.e. reducing the bias RF power from 2800 W to 2400 W, and increasing the He back pressure (inner He/outer He) from 4.5 Torr/9.0 Torr (normal flow recipe) to 7 Torr/9.5

Torr (high flow recipe). The results are summarized in TABLE II below at the following conditions:
  metal density—greater than 35%;
  metal line composition—AlCu (0.5% wt.) alloy;
  bias RF power—AMAT HDP tool: about 2400 W; Novellus HDP tool: less than 2500 W
  line 14, 16 thickness—about 9,000 Å;
  He back pressure—AMAT tool: about 7 Torr/9.5 Torr; Novellus tool: greater than about 9 Torr; and
  BKM recipe.

TABLE II

| Pitch ($\mu$m) | 0.8 | 0.9 | 1.0 | 1.2 | 1.4 | 1.6 |
|---|---|---|---|---|---|---|
| AMAT HDP tool | X | X | X | X | O | O |
| Novellus HDP tool | O | O | O | O | O | O |

As shown in TABLE II above, even with a low bias RF power, metal voids are still an issue when using the AMAT HDP tool at a high metal density (i.e. with a metal density greater than 35%).

Table III

In attempts to remedy the undesirable results for the Novellus HDP tool summarized in TABLE II, experiments were then conducted with only the Novellus HDP tool and at a metal density of less than 35%. The results are summarized in TABLE III below at the following conditions:
  metal density—less than 35%;
  metal line composition—AlCu(0.5% wt.) alloy;
  bias RF power—less than 2500 W;
  line 14, 16 thickness—about 9,000 Å;
  He back pressure—greater than about 9 Torr; and
  BKM recipe.

TABLE III

| Pitch ($\mu$m) | 0.8 | 0.9 | 1.0 | 1.2 | 1.4 | 1.6 |
|---|---|---|---|---|---|---|
| Novellus HDP tool | X | X | X | X | X | X |

As shown in TABLE III above, even after changing to a low metal density (i.e. with a metal density less than 35%), metal void formation was still a problem at all pitches tested when using the Novellus HDP tool at a low bias RF power and a high flow recipe (greater than about 9 Torr). This shows that for a metal density less than $^{35}$%, the metal void issue can not be resolved due to the loading effect of sputtering.

Key Step of the Invention

Figure 2:
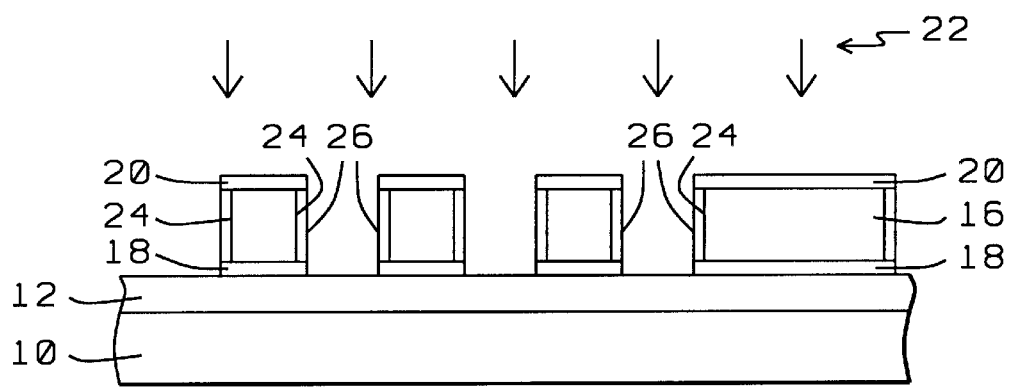
Figure 3:
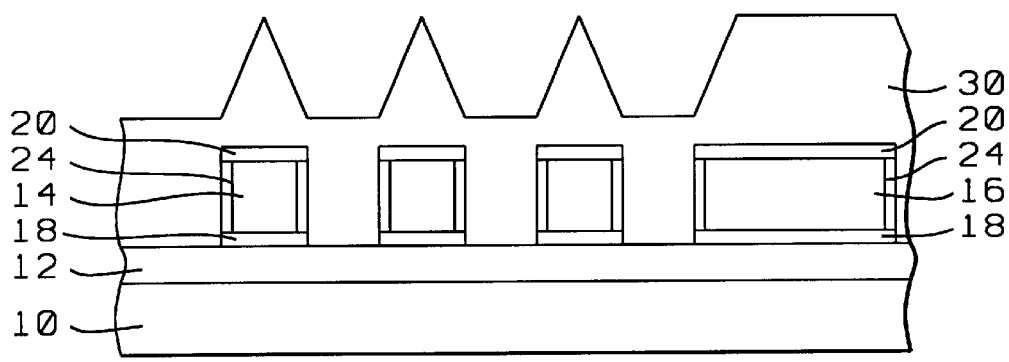

As shown in FIG. 2, in a key step of the present invention, the inventors have discovered that first pre-treating the metallized structure of FIG. 1 with an $N_2O$ treatment 22 before the HDP process using the AMAT or Novellus tools, for example, with BKM recipes to form HDP CVD oxide IMD or passivation layer 30 can be used to solve the metal void problem under a high aspect ratio and with high or low metal density (i.e. greater than 35% or less than 35%, respectively). (The tools may include an $N_2O$ gas line.) Specifically, a $N_2O$ flow of from about 800 to 1600 sccm, and more preferably from about 1400 sccm is applied (as at 22) to the structure of FIG. 1 for from about 40 to 90 seconds, and more preferably 45 seconds, with an RF bias of from about 180 to 220 W, and more preferably about 200 W, at a temperature from about 360 to 440° C., and more preferably from about 380 to 400° C., using an AMAT P5000 chamber, Centura $D_{XZ}$ chamber, or Novellus chamber tool. The $N_2O$ pre treatment may be performed in the same chamber/with the same tool as the AMAT or Novellus tools.

This forms layers 26 of aluminum oxide ($Al_2O$) on the exposed sidewalls 24 of AlCu metal lines 14, 16, respectively. $Al_2O$ layers 26 are from about 50 to 300 Å thick, and are more preferably about 150 Å thick.

That is:

$$3N_2O + 2Al \rightarrow 3N_2 + Al_2O_3$$

where, it is believed:

Al $$3N\equiv N-O+ \rightarrow 3N\equiv N + Al_2O_3$$

Al

It is believed the formation of $Al_2O_3$ layers 26 prevents formation of metal voids during formation of HDP CVD oxide IMD/passivation layer 30 over metal lines 14, 16 because of the thermal stress difference between $Al_2O_3$ and AlCu.

Thus, the $N_2O$ pre-treatment 22 is performed at the following conditions:
  $N_2O$ flow—from about 800 to 1600 sccm, and more preferably from about 1000 to 1400 sccm;
  time—from about 40 to 90 seconds, and more preferably about 45 seconds;
  bias RF power—less than 200 W;
  temperature—from about 360 to 440° C., and more preferably from about 380 to 400° C.;
to form $Al_2O_3$ layer 26 on the exposed sidewalls 24 of AlCu lines 14, 16 having a thickness from about 50 to 300 Å, and more preferably about 150 Å.

The AMAT HDP and Novellus HDP tools were modified to allow for the $N_2O$ treatment of the present invention by adding an $N_2O$ gas line to introduce the $N_2O$ to the metallized wafer before the actual HDP process in forming the HDP CVD oxide IMD or passivation layer 30. That is the process recipe for the PECVD was designed with an $N_2O$ gas line (involved the PEOX, PETEOS). The $N_2O$ gas line can go into the respective tool chamber form injector.

For example, after an $N_2O$ pre-treatment in accordance with the present invention for 45 seconds with an RF bias of 200 W, a temperature of about 400° C., and an $N_2O$ flow of about 1400 sccm, experiments were conducted using an AMAT HDP and a Novellus HDP tool to determine metal void formation. These experiments were conducted at the following conditions, with the results summarized in TABLE IV below:
  metal density—greater than 35% or less than 35%
  bias RF power—about 2800 W;
  metal line composition—AlCu(0.5% wt.) alloy;
  line 14, 16 thickness—about 9,000 Å;
  He back pressure—AMAT tool: about 7 Torr/9.5 Torr; Novellus tool: greater than about 9 Torr; and
  BKM recipe.

TABLE IV

| Pitch (μm) | 0.8 | 0.9 | 1.0 | 1.2 | 1.4 | 1.6 |
|---|---|---|---|---|---|---|
| AMAT HDP tool | O | O | O | O | O | O |
| Novellus tool | O | O | O | O | O | O |

As shown in TABLE IV above, all products passed with no detectable metal voids being formed.

SUMMARY OF THE INVENTION

The AlCu(0.5% wt.) metal line structure of FIG. 1 is subjected to the N$_2$O pre-treatment of the present invention as noted above.

As shown in FIG. 2, the N$_2$O pre-treatment 22 forms Al$_2$O$_3$ layers 26 on exposed sidewalls 24 of AlCu metal lines 14, 16.

Thus, when HDP CVD oxide IMD/passivation layer 30 is formed over AlCu metal lines 14, 16, metal voids are not formed, even for 0.25 μm down t 0.15 μm technology metal lines 14, 16.

While particular embodiments of the present invention have been illustrated and described, it is not intended to limit the invention, except as defined by the following claims.

We claim:

1. A method of forming an HDP CVD oxide layer over a metal line structure, comprising the steps of:
   providing a semiconductor structure having metal lines formed thereon to form a metal line structure; each of said metal lines having exposed metal sidewalls;
   forming a layer of aluminum oxide directly on each of said metal line exposed metal sidewalls by treating said metal line structure with N$_2$O, resulting in an N$_2$O treated metal line structure; and
   forming an HDP CVD oxide layer upon said N$_2$O treated metal line structure to form a resulting metal line structure;
   whereby said resulting metal line structure is free of metal voids.

2. The method of claim 1, wherein said N$_2$O treatment is conducted at an RF bias of from about 180 to 220 W, at an N$_2$O flow of from about 800 to 1600 sccm, at a temperature from about 360 to 440° C., and for from about 40 to 90 seconds.

3. The method of claim 1, wherein said N$_2$O treatment is conducted at an RF bias of about 200 W, at an N$_2$O flow of about 1400 sccm, and at a temperature of about 400° C., for about 45 seconds.

4. The method of claim 1, wherein said N$_2$O treatment is conducted at an RF bias of from about 180 to 220 W, at an N$_2$O flow of from about 900 to 1400 sccm, at a temperature from about 380 to 400° C., for from about 40 to 90 seconds using an AMAT tool.

5. The method of claim 1, wherein said N$_2$O treatment is conducted at an RF bias of from about 180 to 220 W, at an N$_2$O flow of from about 1000 to 1200 sccm, at a temperature from about 385 to 395° C., for from about 40 to 90 seconds using a Novellus tool.

6. The method of claim 1, wherein each of said Al$_2$O$_3$ layer is from about 50 to 300 Å thick.

7. The method of claim 1, wherein each of said Al$_2$O$_3$ layers is about 150 Å thick.

8. The method of claim 1, wherein said HDP CVD oxide layer is formed by a tool selected from the group comprising an AMAT HDP tool and a Novellus HDP tool.

9. The method of claim 1, wherein said HDP CVD oxide layer is formed by a process selected from the group comprising an AMAT HDP process and a Novellus HDP process.

10. The method of claim 1, further including an TiN glue layer joining each metal line to said semiconductor substrate, and a TiN ARC over each said metal line.

11. The method of claim 1, further including a Ti rich TiN glue layer joining each metal line to said semiconductor substrate, said Ti rich TiN glue layer having a thickness from about 130 to 170 Å; and a TiN ARC over each said metal line, said TiN ARC having a thickness from about 500 to 600 Å.

12. The method of claim 1, further including a Ti rich TiN glue layer joining each metal line to said semiconductor substrate, said Ti rich TiN glue layer having a thickness of about 150 Å; and a TiN ARC over each said metal line, said TiN ARC having a thickness o f about 550 Å.

13. The method of claim 1, wherein said metal line structure has a metal density of less than 35%.

14. The method of claim 1, wherein said metal line structure has a metal density of greater than 35%.

15. The method of claim 1, wherein said metal lines are comprised of Al, an AlSiCu alloy, or an AlCu(0.5% wt.) alloy.

16. The method of claim 1, wherein said metal lines are comprised of an AlCu(0.5% wt.) alloy.

17. The method of claim 1, wherein the metal line structure has a design rule down to 0.25 μm.

18. The method of claim 1, wherein the metal line structure has a design rule down to 0.15 μm.

19. A method of forming an HDP CVD oxide layer over a metal line structure, comprising the steps of:
   providing a semiconductor structure having metal lines formed thereon to form a metal line structure; each of said metal lines having exposed metal sidewalls;
   treating said metal line structure with N$_2$O directly contacting said exposed metal sidewalls to form an N$_2$O treated metal line structure having an oxide layer of said metal said N$_2$O treatment being conducted at an RF bias of from about 180 to 220 W, at an N$_2$O flow of from about 800 to 1600 sccm, at a temperature from about 380 to 440° C., for from about 40 to 90 seconds; and
   forming an HDP CVD oxide layer upon said N$_2$O treated metal line structure to form a resulting metal line structure; the HDP CVD oxide layer being an interlevel dielectric layer;
   whereby said resulting metal line structure is free of metal voids.

20. The method of claim 19, wherein said N$_2$O treatment is conducted at an RF bias of about 200 W, at an N$_2$O flow of about 1400 sccm, and at a temperature of about 400° C., for about 45 seconds.

21. The method of claim 19, wherein said N$_2$O treatment is conducted at an RF bias of from about 180 to 220 W, at an N$_2$O flow of from about 900 to 1400 sccm, at a temperature from about 390 to 420° C., for from about 40 to 90 seconds using an AMAT tool.

22. The method of claim 19, wherein said N$_2$O treatment is conducted at an RF bias of from about 180 to 220 W, at an N$_2$O flow of from about 1000 to 1200 sccm, at a temperature from about 385 to 395° C., for from about 40 to 50 seconds using a Novellus tool.

23. The method of claim 19, wherein each of said Al$_2$O$_3$ layer is from about 50 to 300 Å thick.

24. The method of claim 19, wherein each of said Al$_2$O$_3$ layers is about 150 Å thick.

25. The method of claim 19, wherein said HDP CVD oxide layer is formed by a tool selected from the group comprising an AMAT HDP tool and a Novellus HDP tool.

26. The method of claim 19, wherein said HDP CVD oxide layer is formed by a process selected from the group comprising an AMAT HDP process and a Novellus HDP process.

27. The method of claim 19, further including a Ti rich TiN glue layer joining each metal line to said semiconductor substrate, and a TiN ARC over each said metal line.

28. The method of claim 19, further including a Ti rich TiN glue layer joining each metal line to said semiconductor substrate, said Ti rich TiN glue layer having a thickness from about 130 to 170 Å; and a TiN ARC over each said metal line, said TiN ARC having a thickness from about 500 to 600 Å.

29. The method of claim 19, further including a Ti rich TiN glue layer joining each metal line to said semiconductor substrate, said Ti rich TiN glue layer having a thickness of about 150 Å; and a TiN ARC over each said metal line, said TiN ARC having a thickness of about 550 Å.

30. The method of claim 19, wherein said metal line structure has a metal density of less than 35%.

31. The method of claim 19, wherein said metal line structure has a metal density of greater than 35%.

32. The method of claim 19, wherein said metal lines are comprised of Al, an AlSiCu alloy, or an AlCu (0.5% wt.) alloy.

33. The method of claim 19, wherein said metal lines are comprised of an AlCu (0.5% wt.) alloy.

34. The method of claim 19, wherein the metal line structure has a design rule down to 0.25 μm.

35. The method of claim 19, wherein the metal line structure has a design rule down to 0.15 μm.

36. A method of forming an HDP CVD oxide interlevel dielectric layer over a metal line structure using an AMAT HDP process, the metal line structure having exposed metal, the improvement comprising:

pre-treating said metal line structure before said AMAT HDP process with an $N_2O$ process conducted at an RF bias of from about 180 to 220 W, at an $N_2O$ flow of from about 800 to 1600 sccm, at a temperature from about 360 to 440° C., and for from about 40 to 90 seconds;

wherein $N_2O$ contacts directly said exposed metal to form an oxide layer of said metal.

37. The method of claim 36, wherein said $N_2O$ process is conducted at an RF bias of about 200 W, at an $N_2O$ flow of about 1400 sccm, and at a temperature of about 400° C., for about 45 seconds.

38. A method of forming an HDP CVD oxide layer over a metal line structure using a Novellus HDP process, the improvement comprising:

pre-treating said metal line structure before said Novellus HDP process with an $N_2O$ process conducted at an RF bias of from about 180 to 220 W, at an $N_2O$ flow of from about 800 to 1600 sccm, at a temperature from about 360 to 440° C., and for from about 40 to 90 seconds;

wherein $N_2O$ contacts directly said exposed metal to form an oxide layer of said metal.

39. The method of claim 38, wherein said $N_2O$ process is conducted at an RF bias of about 200 W, at an $N_2O$ flow of about 1400 sccm, and at a temperature of about 400° C., for about 45 seconds.

* * * * *

UNITED STATES PATENT AND TRADEMARK OFFICE
CERTIFICATE OF CORRECTION

PATENT NO. : 6,566,263 B1
DATED : May 20, 2003
INVENTOR(S) : Mong-Chi Hung, Ming-Tsong Wang and Teh-Wei Ger It is certified that error appears in the above-identified patent and that said Letters Patent is hereby corrected as shown below:

<u>Title page,</u>
Item [75], delete "Mong-Chi Hung, Yurdin (TW)" and replace it with -- Mong-Chi Hung, Yun-Lin (TW) --.

Signed and Sealed this

Fifteenth Day of July, 2003

JAMES E. ROGAN
*Director of the United States Patent and Trademark Office*